United States Patent
Sato et al.

(10) Patent No.: US 6,671,653 B2
(45) Date of Patent: Dec. 30, 2003

(54) SEMICONDUCTOR TEST SYSTEM AND MONITOR APPARATUS THEREOF

(75) Inventors: Atsushi Sato, Fukaya (JP); Masafumi Nakamura, Gyoda (JP); Tsuyohiro Ihata, Oyama (JP)

(73) Assignee: Advantest Corp., Tokyo (JP)

( * ) Notice: Subject to any disclaimer, the term of this patent is extended or adjusted under 35 U.S.C. 154(b) by 63 days.

(21) Appl. No.: 10/074,630

(22) Filed: Feb. 13, 2002

(65) Prior Publication Data

US 2002/0165692 A1 Nov. 7, 2002

Related U.S. Application Data

(63) Continuation-in-part of application No. PCT/JP01/05035, filed on Jun. 13, 2001.

(51) Int. Cl.$^7$ .............................................. G01R 31/00
(52) U.S. Cl. .................................... 702/181; 702/118
(58) Field of Search ................................. 702/181, 182, 702/187, 188, 189, 108, 118, 121; 361/160, 191, 211; 365/189.07, 201; 714/718, 724, 738

(56) References Cited

U.S. PATENT DOCUMENTS

| 5,812,424 A | * | 9/1998 | Chikyu | 361/191 |
| 6,181,616 B1 | * | 1/2001 | Byrd | 365/201 |
| 6,532,561 B1 | * | 3/2003 | Turnquist et al. | 714/738 |

FOREIGN PATENT DOCUMENTS

| JP | 6-80155 | 11/1994 |
| JP | 7-5076 | 1/1995 |
| JP | 10-332791 | 12/1998 |

* cited by examiner

Primary Examiner—Bryan Bui
(74) Attorney, Agent, or Firm—Muramatsu & Associates

(57) ABSTRACT

The present invention provides a semiconductor test system and a monitor apparatus for monitoring a test history such as numbers of operation of relays. The semiconductor test system tests a semiconductor device by controlling test circuits therein through a tester bus and monitors the test history. The test system includes a plurality of buffer circuits for receiving signal information from the tester bus and storing the signal information therein, and a computer for storing the signal information from the buffer circuits in a file and analyzing the signal information in the file.

17 Claims, 11 Drawing Sheets

Fig.10

| Address | Serach Data Storage | |
|---|---|---|
| 1 | | ⎫ N/C |
| 2 | | ⎭ |
| 3 | 1 | |
| 4 | 3 | |
| 5 | 5 | |
| 6 | 6 | |
| 7 | 9 | |
| 8 | 10 | ← 1st |
| 9 | 11 | ← 4th (Serach Success) |
| 10 | 13 | ← 3rd |
| 11 | 15 | |
| 12 | 20 | ← 2nd |
| 13 | 23 | |
| 14 | 24 | |
| 15 | 25 | |
| nMAX → 16 | 28 | ← Zero |

SEMICONDUCTOR TEST SYSTEM AND MONITOR APPARATUS THEREOF

This application is a continuation-in-part of PCT/JP01/05035 filed Jun. 13, 2001.

TECHNICAL FIELD

The present invention relates to a semiconductor test system, and a monitor apparatus and a filter device incorporated with the semiconductor test system for individually monitoring information on certain components used in the semiconductor test system, such as numbers of operation of relays, and for effectively maintaining such components to easily achieve high reliability of the semiconductor test system.

BACKGROUND ART

An example of the structure and operation of the semiconductor test system in the conventional technology will be briefly explained with reference to FIGS. 5–7.

As shown in FIG. 7, the semiconductor test system is comprised of an engineering work station (EWS) 10, a main frame 20, a test head 30, a performance board 80, and an IC socket 90.

The work station 10 is an input and output means for man/machine interfacing between the semiconductor test system and a user.

The main frame 20 includes various power sources, a tester processor, and test units for corresponding test pins (test channels) of the semiconductor test system.

The test head 30 includes a large number of printed circuit boards forming pin electronics 40 which are electronic circuits establishing a large number of test channels (test pins) noted above.

The performance board 80 is a printed circuit board designed for a specific semiconductor device to be tested (hereafter "DUT"). The performance board 80 is interchangeable. The IC socket 90 corresponding to the DUT is mounted on the performance board 80.

The IC socket 90 is a socket having a number of pins, size and shape corresponding to the semiconductor device to be tested.

In the semiconductor test system configured as described above, a device test proceeds as follows with reference to the block diagram of FIG. 5.

Here, in order to simplify the explanation, the diagram of FIG. 5 shows only one test channel, i.e., one pin electronics 40. However, it should be noted that a large number of such test channels are established in an actual test system. Thus, in the case where the test system has 512 test channels, 512 pin electronics 40 each being configured as shown in FIG. 5 are installed in the test system.

When conducting a DC parametric test, for example, by supplying a voltage and measuring a resultant current, a relay S12 is turned off (break) and a relay S11 is turned on (make). A direct current (DC) test unit 8 generates a test voltage which is applied to an intended pin of the DUT 91, and a current flowing through the pin is measured.

When conducting a functional test for each I/O pin of the DUT 91, the functional test is performed in the manner described in the following.

The pattern generator 5 generates a logic data, which is synchronized with the reference clock signal generated by the timing generator 4.

The wave formatter 6 generates a test pattern based on the logic data from the pattern generator 5 and the reference clock signal from the timing generator 4.

In the pin electronics 40, relays S11 and S13 are turned off and relay S12 is turned on, and the test pattern is amplified to a predetermined voltage level (VIH/VIL) by a driver D11 and is supplied to the corresponding pin of DUT 91.

The response output signal from the DUT 91 is terminated by a resistor R1 while the relay S11 is turned off and the relay S13 is turned on. Also, the relay S12 is turned on so that the output signal is converted to a logic signal by a comparator C11 and is output therefrom.

By the logic comparator 7, the resultant logic signal is compared with an expected value produced by the pattern generator 5 at the timing of a strobe signal from the timing generator 4. The logic comparator 7 determines whether the output signal of DUT 91 matches the expected value, i.e., pass or fail of the test on the DUT 91.

An example of relay control in the pin electronics 40 and the operation of functional blocks in the test system will be explained with reference to FIG. 6.

Here, it is assumed that relays S11–S1n represent relays corresponding to all of the test channels of the pin electronics in the semiconductor test system.

As shown in FIG. 6, the semiconductor test system includes the functional blocks, such as a tester processor 2 for overall control of the test system, a control unit 3, the timing generator 4, the pattern generator 5, the wave formatter 6, the logic comparator 7, and the DC test unit 8. The above noted functional blocks are connected and controlled through a tester bus 200.

The tester bus 200 is structured by lines for 8-bit address and data, for example, and control signals including clocks. The tester bus 200 serially transfers 32-bit address and 32-bit data by dividing the data into each 8-bit data.

The control unit 3 sends control signals to the test head 100. The control signals include supply voltage levels (VIH/VIL) of the drivers 11 in the pin electronics 40 and control data to a relay control circuit 31.

Although the block diagram of FIG. 6 illustrates each of the control unit 3 and other functional blocks as one unit, such unit and blocks may be combined together or a plurality of same units and blocks may be incorporated in the test system.

The relay control circuit 31 generates control signals for determining which relays of which channels should be controlled.

As an example, the relays S11–S1n are reed relays which turn on (make) or turn off (brake) by controlling the on/off of the electromagnetic coils through drivers D21–D2n.

When three relays are used per channel for a test system of 512 test channels, then the total number of relays will be 1,536.

Since the actual number of relays used is about 3–8 per test channel depending on the type of the pin electronics, the overall number of relays becomes very large.

The relays S1–S1n will be turned on/off in a dry condition where contact points are not flowing current, or will be turned on/off in a wet condition where the contact points are flowing current.

Typically, for attaining a longer life span, the relays S11–S1n are turned on/off in the dry condition, however, they will sometimes be turned on/off in the wet condition depending on the test conditions and purposes.

The description will be made in the following regarding the maintenance of a semiconductor test system.

A semiconductor test system uses a large number of components having relatively short life spans, such as reed relays and motors, and capacitors whose performances will change with lapse of time.

Therefore, information regarding the number of operations of the relays is accumulated by a counter 1 which counts the number of ON/OFF control signals.

However, in practice, it is difficult to find an appropriate time to exchange the relays since the number of on/off operations of a relay varies depending on the test program. Further, there is a significant difference in the life span of the relays between the on/off operations in the dry condition and wet condition. Further, the total number of relays and other short-life components is large, it requires a complicated procedure to acquire sufficient information regarding the status of such components.

DISCLOSURE OF THE INVENTION

As described in the foregoing, in the conventional semiconductor test system, it is difficult to fully perform the maintenance work because it is not possible to obtain individual information regarding each short life component and time changing component.

Therefore, the present invention was made in view of such problems, and it is an object of the present invention to provide a semiconductor test system and an associated monitor apparatus which is capable of monitoring the test histories, for example, numbers of operations of mechanical components such as relays.

In searching the monitor information such as a test history through the tester bus, a data search and retrieve operation takes a long time if it is done by a traditional software process because it requires a time, such as 10 μs, for retrieving the result data to a computer and display the result data in addition to a time for processing the measured data by the computer.

Therefore, it is not practically possible to reduce the time for retrieving the data in the conventional technology even when a high speed computer is used.

Accordingly, it is a further object of the present invention to provide a filter device for use with the semiconductor test system and monitor apparatus for improving the data search speed when retrieving the monitor information through the tester bus.

To achieve the above object, the first aspect of the present invention is a semiconductor test system which is comprised of:
 a memory means for storing information concerning control signals;
 an analysis means for analyzing the information on the control signals read from the memory means; and
 a life-predicting means for predicting life spans of components of short life based on the analyzed information obtained by the analysis means.

To achieve the above object, the second aspect of the present invention is a semiconductor test system which is comprised of:
 a memory means for storing information concerning control signals; and
 an analysis means for analyzing the information on the control signals read from the memory means;
 thereby monitoring a test history associated with the semiconductor test system.

To achieve the above object, the third aspect of the present invention is a semiconductor test system which is comprised of:
 a memory means for storing information concerning control signals;
 a filter means for retrieving information in the control signals read from the memory means based on retrieved data;
 an analysis means for analyzing the information in the signal retrieved by the filter means; and
 a life-predicting means for predicting life spans of components of short life based on the analyzed information obtained by the analysis means.

To achieve the above object, the fourth aspect of the present invention is a semiconductor test system for testing a semiconductor device by controlling test circuits in the test system through a tester bus and for monitoring a test history thereof, which is comprised of:
 a plurality of buffer circuits for receiving signal information from the tester bus and temporarily storing the signal information therein; and
 a computer for storing the signal information from the buffer circuits in a file and analyzing the signal information in the file.

To achieve the above object, the fifth aspect of the present invention is a semiconductor test system for testing a semiconductor device by controlling test circuits in the test system through a tester bus and for monitoring a test history thereof, which is comprised of:
 a first buffer for receiving signal information from the tester bus and temporarily storing the signal information therein;
 a second buffer for receiving signal information from the tester bus and temporarily storing the signal information therein;
 a first switch means for alternately providing the signal information from the tester bus to the first buffer or the second buffer;
 a second switch means for selecting the second buffer when the first switch connects to the first buffer and for selecting the first buffer when the first switch connects to the second buffer, and alternately outputting the signal information; and
 a computer for storing the signal information from the second switch means in a file and analyzing the signal information in the file.

To achieve the above object, the sixth aspect of the present invention is the semiconductor test system in the third, fourth and fifth aspects of the present invention in which the monitored test history is an accumulated value of numbers of operation of relays in the semiconductor test system.

To achieve the above object, the seventh aspect of the present invention is the semiconductor test system in the sixth aspect of the present invention in which the monitored test history is an accumulated value of numbers of wet and dry operations of the relays in the semiconductor test system.

To achieve the above object, the eighth aspect of the present invention is the semiconductor test system in the sixth and seventh aspects of the present invention in which a limit number is defined for the accumulated value to display a warning signal when the accumulated value reaches the limit number.

To achieve the above object, the ninth aspect of the present invention is the semiconductor test system in the third, fourth and fifth aspects of the present invention which further comprises a filter means for allowing only predetermined signals in the signal information on the tester bus to transfer to the buffer circuit.

To achieve the above object, the tenth aspect of the present invention is a semiconductor test system for testing a semiconductor device and monitoring a test history thereof, which is comprised of:

a buffer circuit for storing control signal information regarding controls in the semiconductor test system; and a computer for storing the signal information from the buffer circuit in a file and analyzing the signal information in the file.

To achieve the above object, the eleventh aspect of the present invention is a monitor apparatus for use with a semiconductor test system for testing a semiconductor device and monitoring a test history, which is comprised of:

a plurality of buffer circuits connected to a tester bus which controls test circuits in the semiconductor test system for alternately storing control signal information on the tester bus; and a computer for alternately receiving the signal information from the buffer circuit and storing the signal information in a file and analyzing the signal information in the file.

To achieve the above object, the twelfth aspect of the present invention is a monitor apparatus for use with a semiconductor test system for testing a semiconductor device and monitoring a test history, which is comprised of:

a first buffer connected to a tester bus of the semiconductor test system for receiving signal information from the tester bus and temporarily storing the signal information therein;

a second buffer connected to a tester bus of the semiconductor test system for receiving signal information from the tester bus and temporarily storing the signal information therein;

a first switch means for alternately providing the signal information from the tester bus to the first buffer or the second buffer;

a second switch means for selecting the second buffer when the first switch connects to the first buffer and for selecting the first buffer when the first switch connects to the second buffer, and alternately outputting the signal information; and a computer for storing the signal information from the second switch means in a file and analyzing the signal information in the file.

To achieve the above object, the thirteenth aspect of the present invention is the monitor apparatus for use with a semiconductor test system in the tenth, eleventh and twelfth aspects of the present invention in which the monitored test history is an accumulated value of numbers of operation of relays in the semiconductor test system.

To achieve the above object, the fourteenth aspect of the present invention is the monitor apparatus for use with a semiconductor test system in the thirteenth aspect of the present invention in which the monitored test history is an accumulated value of numbers of wet and dry operations of the relays in the semiconductor test system.

To achieve the above object, the fifteenth aspect of the present invention is the monitor apparatus for use with a semiconductor test system in the thirteenth and fourteenth aspects of the present invention in which a limit number is defined for the accumulated value to display a warning signal when the accumulated value reaches the limit number.

To achieve the above object, the sixteenth aspect of the present invention is the monitor apparatus for use with a semiconductor test system in the tenth, eleventh and twelfth aspects of the present invention which comprises a filter means for allowing only predetermined signals in the signal information on the tester bus to transfer to the buffer circuit.

To achieve the above object, the seventeenth aspect of the present invention is a monitor apparatus for use with a semiconductor test system which tests a semiconductor device under test by controlling a plurality of relays therein, which is comprised of:

a means for storing a number of ON/OFF operations of the relays under dry condition wherein no electric current flows through contacts of the relays and a number of ON/OFF operations of the relays under wet condition wherein electric current flows through the contacts of the relays; and a means for analyzing a test history based on the number of ON/OFF operations stored in the storing means.

To achieve the above object, the filter means in the third aspect of the present invention is a filter device comprised of:

a memory means for storing search data therein;

a data comparison means for comparing the search data from the memory means with input data;

thereby producing search results obtained through a binary search process.

To achieve the above object, the filter means in the third aspect of the present invention is a filter device characterized in that a memory means for storing search data therein is a register which stores a $2^n$ value which is closest to and larger than the number of search data.

To achieve the above object, the filter means in the third aspect of the present invention further includes a timing generation means for generating a search timing signal upon receiving a search start signal.

To achieve the above object, the filter means in the third aspect of the present invention includes an address generation means which is comprised of a full adder for performing addition or complement-one addition upon receiving the comparison result from the data comparison means, and a register for storing the result of addition from the full adder.

To achieve the above object, the filter means in the third aspect of the present invention includes:

a buffer for receiving signals on the tester bus of the semiconductor test system;

a gate means for transferring a gate output upon receiving an address bus signal and a data bus signal from the output of the buffer;

wherein a flag indicating a successful search in the binary search process is used as a gate signal for the gate means upon receiving the address signal from the output of the buffer as input data.

BRIEF DESCRIPTION OF THE DRAWINGS

FIG. 10 is a diagram for explaining an operation of the binary search process.

BEST MODE FOR IMPLEMENTING THE INVENTION

A structure and operation of the embodiment of the present invention will be explained with reference to FIGS. 1–4.

The essential functional blocks and components in the semiconductor test system are similar to those in the conventional test system described in the foregoing. Thus, the description of the semiconductor test system common to the conventional technology is not repeated here.

Further, the test procedures in the semiconductor test system are similar to that described in the foregoing, thus, no further description is provided here.

First, the feature of the present invention is described with respect to the control of relays in the pin electronics 40 and a unit control signal for each test circuit unit.

Figure 1:
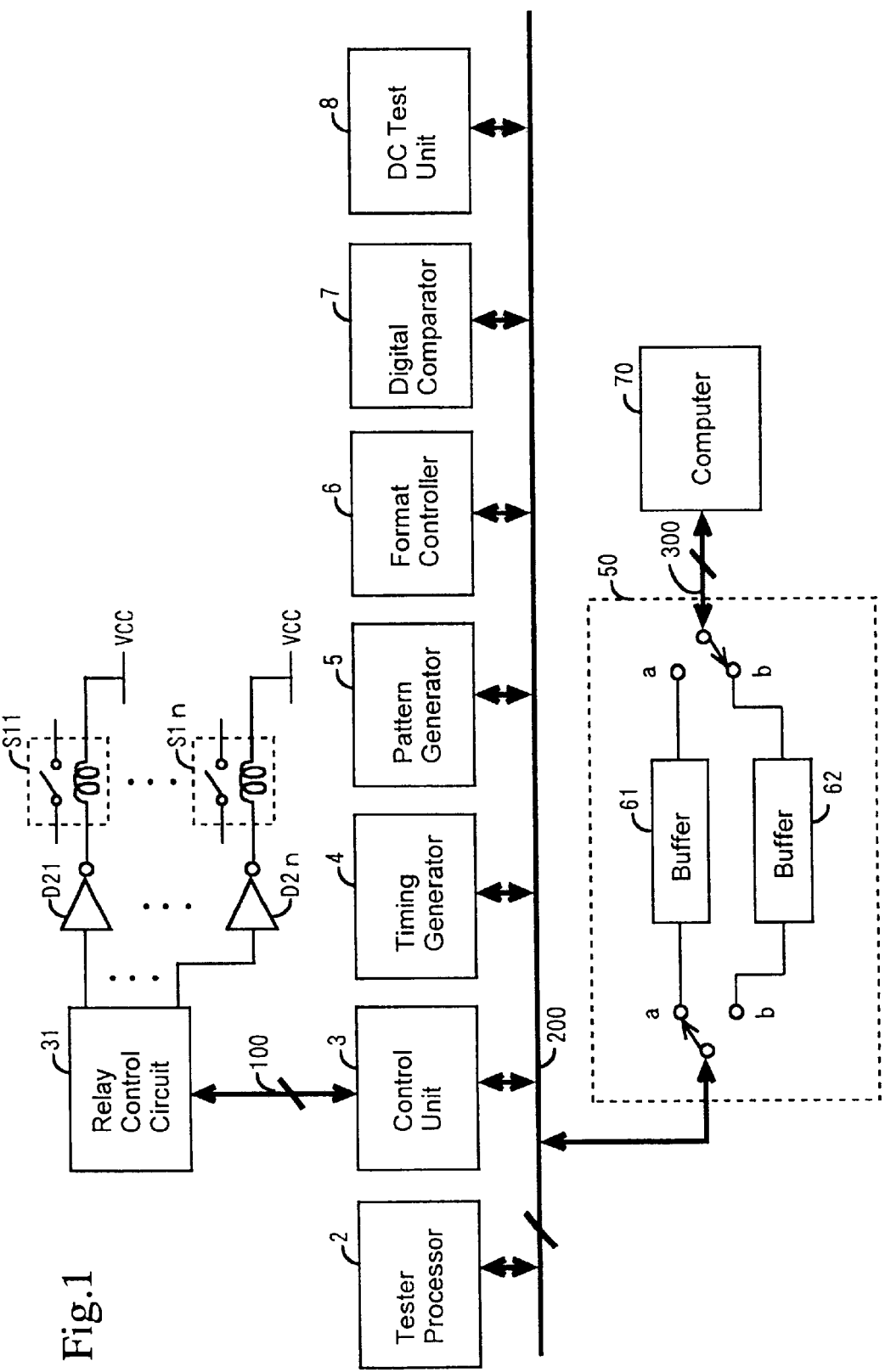
FIG. 1 is a block diagram showing a semiconductor test system of the present invention.

As shown in FIG. 1, similar to the conventional example, the semiconductor test system includes a tester processor 2 for overall control of the test system, a control unit 3, the timing generator 4, the pattern generator 5, the wave formatter 6, the logic comparator 7, and the DC test unit 8, respectively connected to and controlled through the tester bus 200.

The control of the relays S11–S1n based on the relay control circuit 31 is similar to that in the conventional version except that the counter 1 is no longer used, thus the explanation of which is omitted here.

The semiconductor test system in the present invention is unique in that it has a buffer circuit 50 connected to the tester bus 200 and a computer 70 connected to the buffer circuit 50 through a bus 300.

The computer 70 is, for example, a personal computer that stores the data received from the buffer circuit 50, analyzes the stored data, and displays the analyzed data.

An example of structure in the buffer circuit 50 and the operation thereof is explained in the following with reference to FIG. 4.

Figure 4:
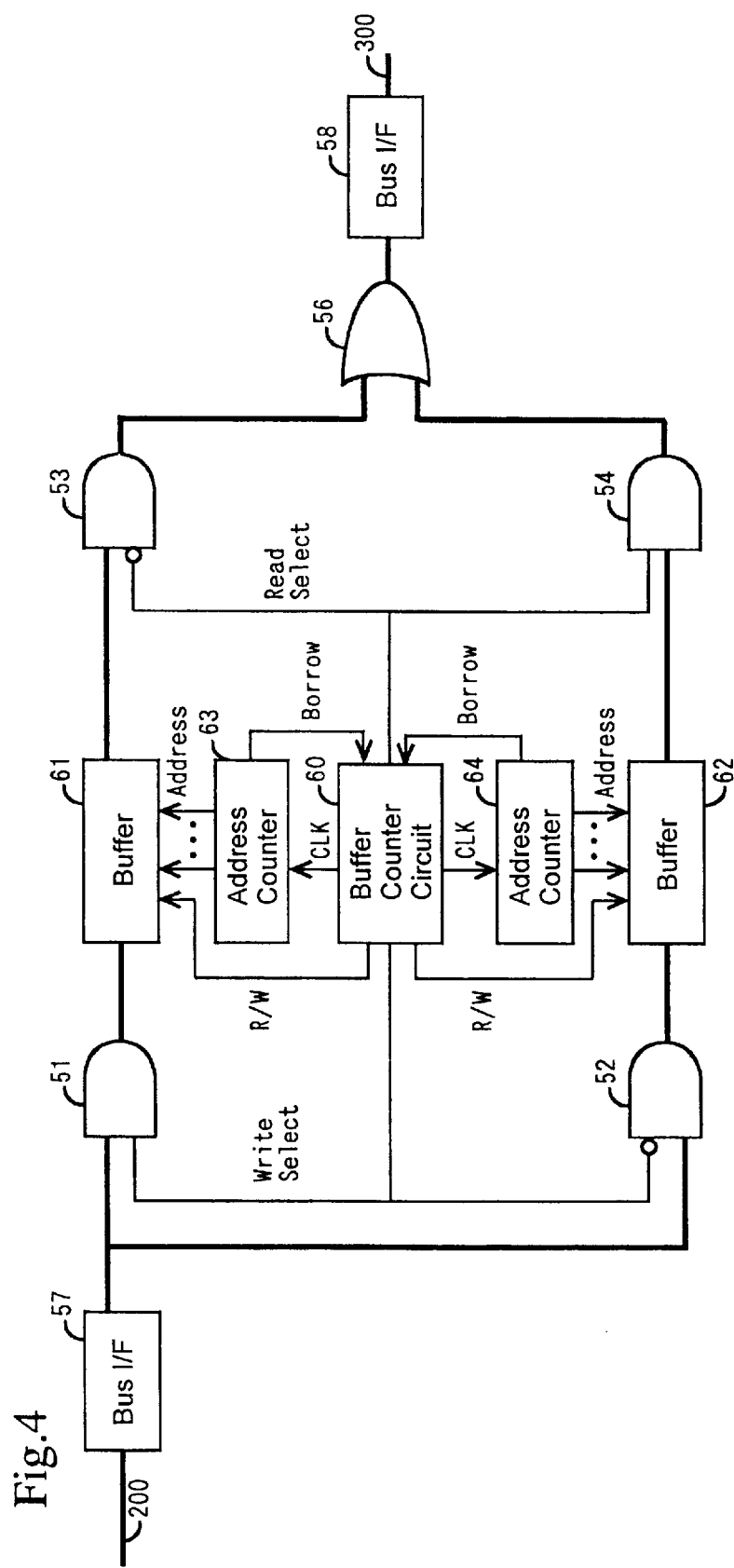
FIG. 4 is a circuit diagram showing a buffer circuit for use with the semiconductor test system of the present invention.

In FIG. 4, the buffer circuit 50 is comprised of bus interfaces 57 and 58, AND gates 51–54, an OR gate 56, a buffer control circuit 60, buffers 61 and 62, and address counters 63 and 64.

The bus interface 57 is an interface for connecting the buffer circuit 50 to the tester bus 200 in order to receive the signal information on the tester bus 200.

The bus interface 58 is a bus interface for connecting the buffer circuit 50 to the computer 70 in order to transmit the signal information.

The AND gates 51 and 52 are switching means for switching the signal information from the tester bus 200 and transferring the signal information to either the buffer 61 or the buffer 62 in response to a selection signal (Write Select) from the buffer control circuit 60.

The AND gates 53 and 54 are switching means for switching and transmitting the data read from either the buffer 61 or the buffer 62 in response to a selection signal (Read Select) from the buffer control circuit 60.

Then, the OR gate 56 provides the output either from the AND gate 53 or AND gate 54 to the bus interface 58.

The buffers 61 and 62 are storage means such as semiconductor memories controlled by read/write (R/W) control signals from the buffer control circuit 60. The buffers 61 and 62 write or read the data in the addresses specified by the address data from the address counters 63 and 64, respectively. Each of the buffers 61 and 62 has a memory capacity of, for example, 2 MB.

Such a memory capacity of the buffers 61 and 62 is determined by the relationship between the transmission speeds of the tester bus 200 and the bus 300.

The buffer control circuit 60 controls an overall operation of the buffer circuit 50. Such control operations by the buffer control circuit 60 include: providing a write synchronous signal to the buffers 61 and 62 upon receiving a synchronous clock signal, producing the selection signal (Write Select) for the AND gates 51 and 52, generating the read/write control signal for the buffers 61 and 62, providing the clock signal to the address counters 63 and 64 to increment the address data, and producing the selection signal (Read Select) for the AND gates 53 and 54.

The timings and operations for alternatively selecting the write/read sequences of the buffers 61 and 62 are performed as follows.

The buffer 61 is changed from the write operation to the read operation when the read operation of the buffer 62 is completed and data is fully written in the buffer 61. The timing of changing the buffer 61 from the write operation to the read operation is determined by a timing of a borrow signal (for borrowing the next digit) generated by the address counter 63.

The buffer 62 is changed from the read operation to the write operation when the read operation of the buffer 62 is completed and data is fully written in the buffer 61. The timing of changing the buffer 62 from the read operation to the write operation is determined by a timing of a borrow signal (for borrowing the next digit) generated by the address counter 63.

The buffer 61 is changed from the read operation to the write operation when the read operation of the buffer 61 is completed and data is fully written in the buffer 62. The timing of changing the buffer 61 from the read operation to the write operation is determined by a timing of a borrow signal (for borrowing the next digit) generated by the address counter 64.

The buffer 62 is changed from the write operation to the read operation when the read operation of the buffer 61 is completed and data is fully written in the buffer 62. The timing of changing the buffer 62 from the write operation to the read operation is determined by a timing of a borrow signal (for borrowing the next digit) generated by the address counter 64.

The information data stored in the buffer circuit 50 is read continuously and transferred to the computer 70 through the bus 300.

Figure 2:
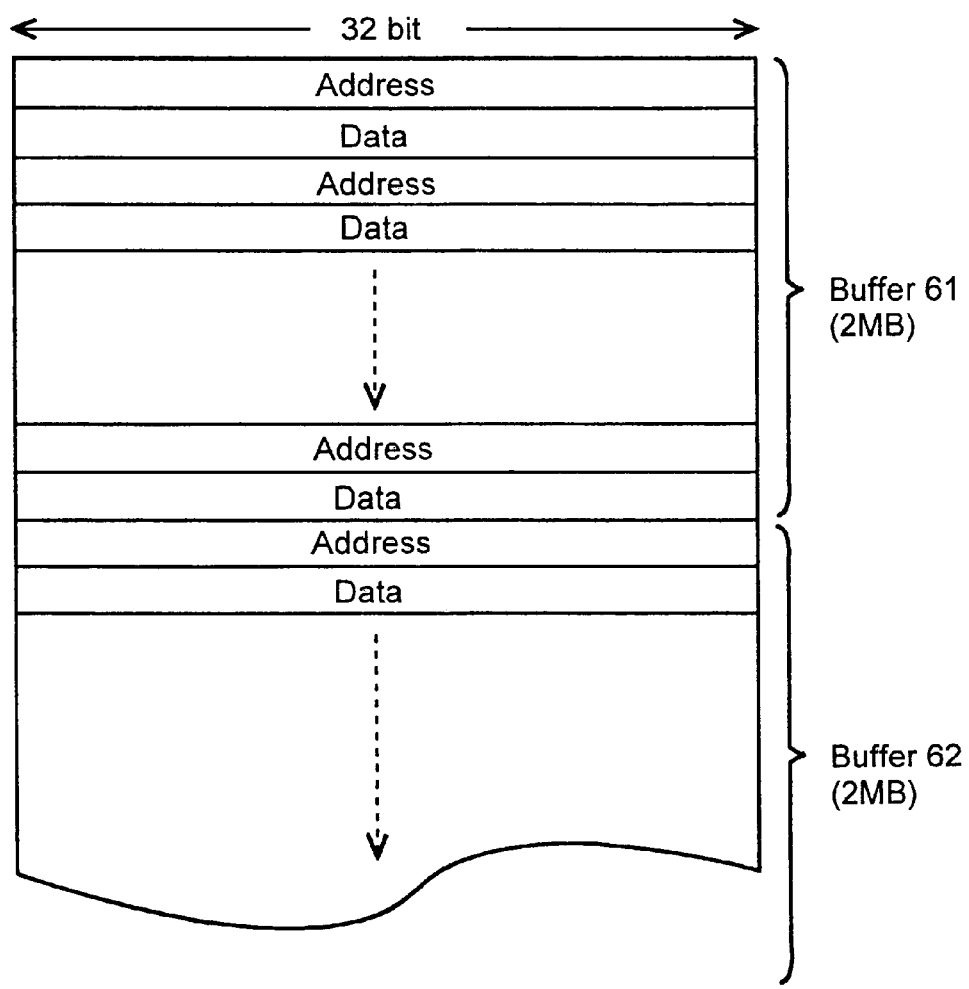
FIG. 2 is a diagram showing the information data retrieved from the semiconductor test system of the present invention.

The information data transferred to the computer 70 is, as shown in FIG. 2, a continuous data of the 32-bit (half word) address and the 32-bit (half word) data. The information data is alternately selected and read from the buffers 61 and 62 at every 2 MB.

Then, the computer 70 converts the information data to data files, processes and converts the data to appropriate forms, and displays the results and/or issues an alarm or warning.

Next, an example of process in the method for monitoring the test histories of components involved in the semiconductor test system of the present invention will be explained in detail.

Figure 5:
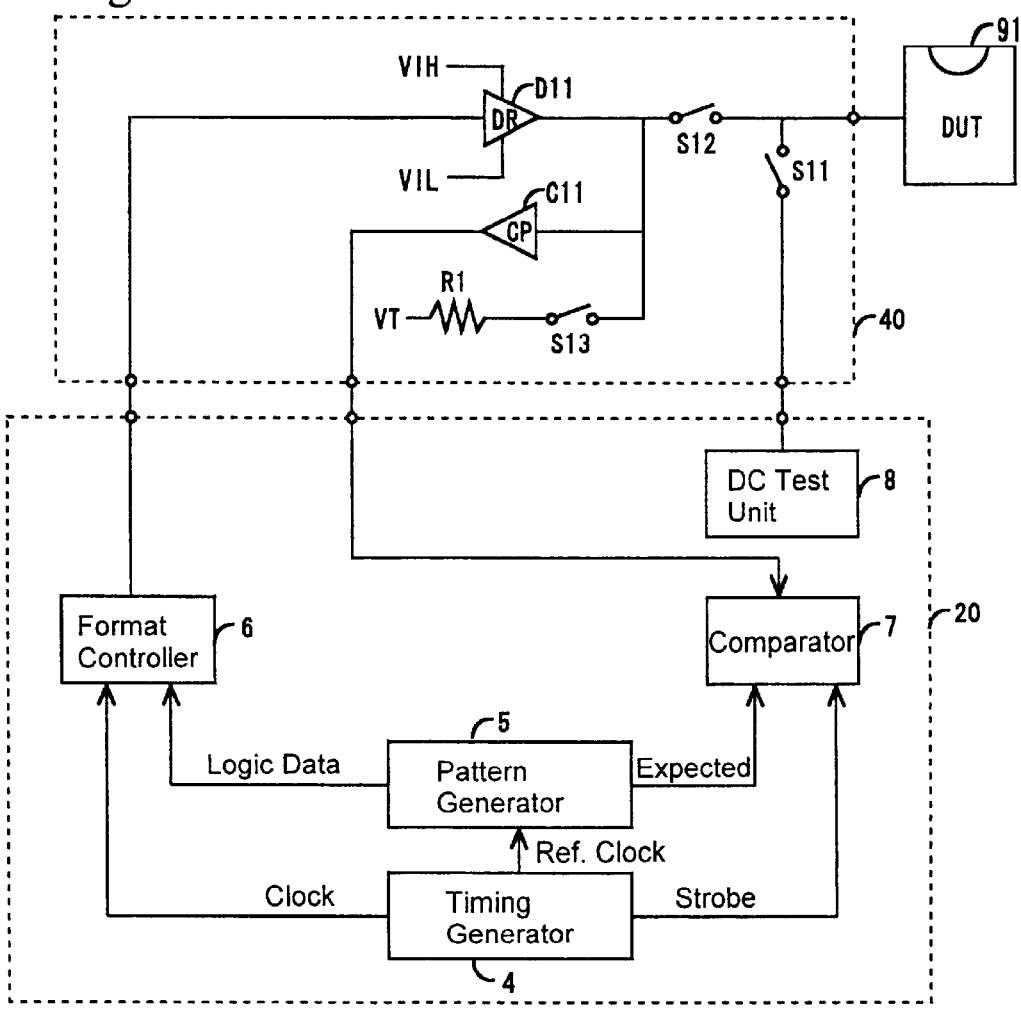
FIG. 5 is a block diagram showing a structure involved in test signals in the semiconductor test system.
Figure 6:
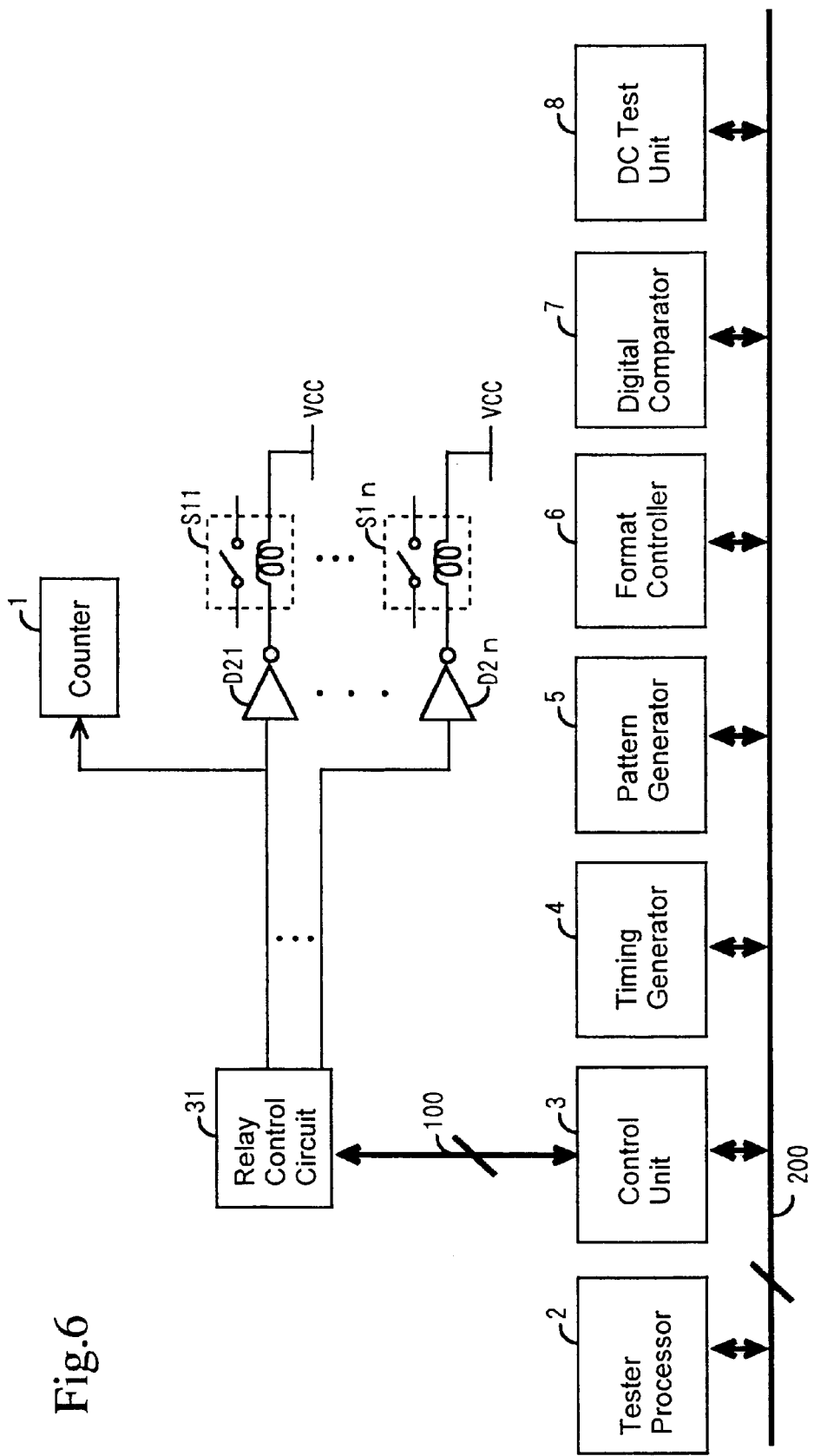
FIG. 6 is a block diagram showing a conventional semiconductor test system.
Figure 7:
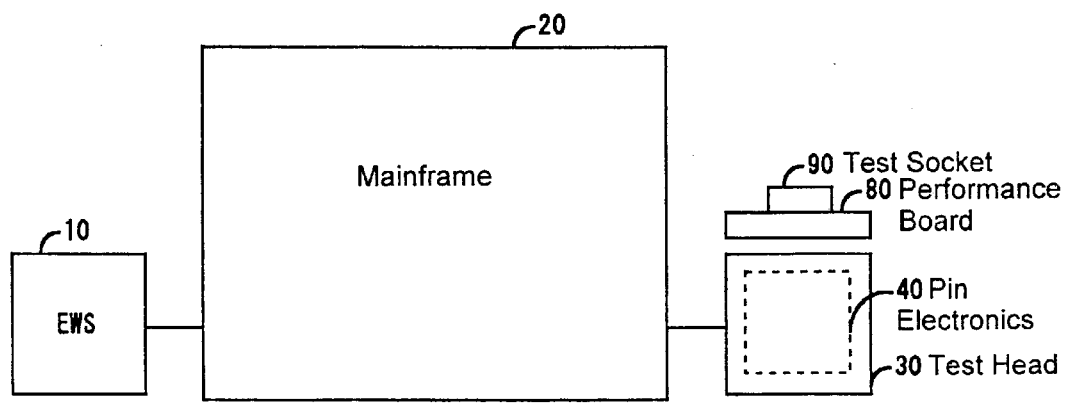
FIG. 7 is a schematic diagram showing a basic structure of the semiconductor test system.

This example shows a case where the number of operations of the relay S11 shown in FIGS. 1 and 5 is monitored. In this procedure, a limit value of the number of operations is defined and when the number of operations exceeds the limit value, the monitor apparatus displays a warning sign. Such a procedure is shown in the flow diagram of FIG. 3.

(1) After the start of procedure, at step 400, it is determined whether the semiconductor test system is in operation, and if it is, the process moves to step 410, and if not, the process ends (step 400).

(2) The process reads the 32-bit (half word) address from the buffer circuit 50 (step 410).

(3) If the address includes the relay information, the process moves to step 430, and if no relay information is included, the process moves to step 421 (step 420).

(4) The data (half word) following the half word of the address is sent as empty data and the process goes back to step 400 (step 421).

(5) The process reads the 32-bit (half word) data information (such as relay control data) which follows the address (step 430).

(6) If the relay control data is the one to turn the relay S11 on, then the process moves to step 460, while the control data is not the one to turn the relay S11 on, the process goes back to step 400 (step 450).

(7) The process determines whether the previous control data is to turn the relay S11 off. If the answer is yes, the process moves to 470 while the answer is no, the process returns to step 400 (step 460).

(8) It is further determined whether the direct current (DC) test unit (UDC) is in operation, and if it is in operation, the process moves to step 480, and if it is not in operation, the process moves to step 481.

(9) The number of operations accumulated in a wet counter is incremented by one (step 480).

(10) The number of operations accumulated in a dry counter is incremented by one (step 481).

(11) It is determined if the accumulated value in the wet counter regarding the relay S11 exceeds the limit value, and if so, the process moves to step 500, and if it does not exceed the limit value, the process goes back to step 400 (step 490).

(12) It is determined if the accumulated value in the dry counter regarding the relay S1 exceeds the limit value, and if so, the process moves to step 500, and if it does not exceed the limit value, the process goes back to step 400 (step 491).

(13) When the accumulated value of the wet counter or the dry counter exceeds the corresponding limit value of the relay S11, the process displays a warning sign.

Through the foregoing process, the data concerning the number of operations in the dry condition and the wet condition is separately accumulated. Thus, the lead relays having differences in life span depending on whether the on/off operation are done under the dry condition or wet condition can be individually monitored. As a consequence, it is possible to determine the appropriate timings to replace the reed relays.

Figure 3:
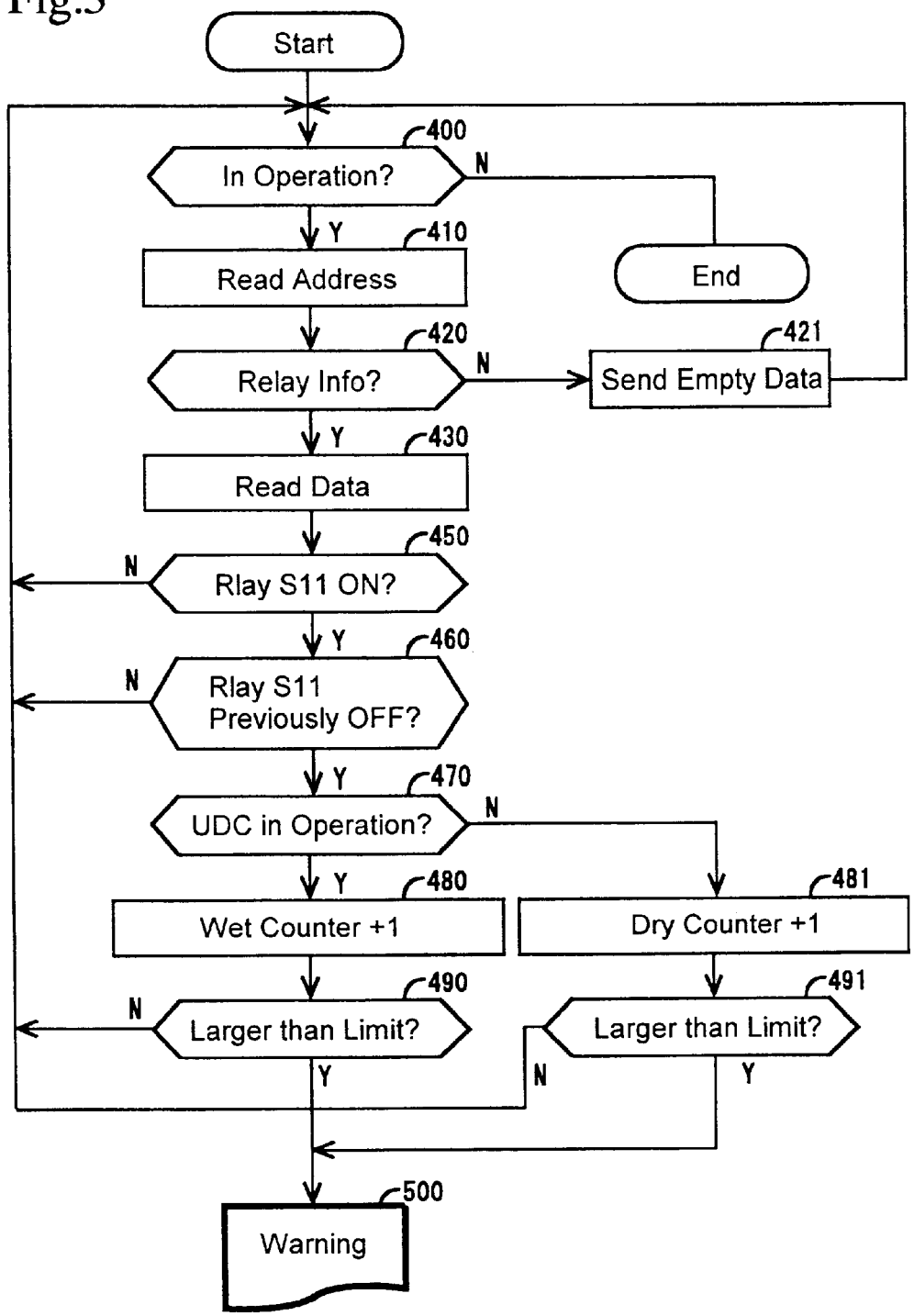
FIG. 3 is a flow chart of the semiconductor test system of the present invention.

In the foregoing, the flow chart of FIG. 3 is explained with respect to only the relay S11, however, it is apparent that this process is applicable to all the other relays S12–S1n since the files of the computer 70 include data information concerning various historical test information of the semiconductor test system.

Further, it is also possible to predict the remaining life span of the relays by analyzing the historical information of the semiconductor test system and the current operational conditions of the relays.

Moreover, since the historical information of the operation time for other components such as motors and capacitor ripples can be obtained, analyzed, and displayed, the life predictions of short-life components and maintenance management thereof can be individually conducted.

In the foregoing, the process of retrieving the historical test information is explained as being done by the semiconductor test system having a monitoring capability, however, the historical test information can also be obtained by connecting a monitor apparatus comprised of the buffer circuit 50 and computer 70 to the conventional semiconductor test system.

Since the information on the tester bus 200 includes unnecessary information to be retrieved as historical test information, a filter device for removing the unnecessary information may be employed to reduce the necessary memory capacity of the buffer circuit.

The monitor apparatus for the historical information of the semiconductor test system of the present invention retrieves the required data through the tester bus independently from the operation of the semiconductor test system. Thus, the monitor apparatus will not inversely affect the operation such as test through put of the semiconductor test system.

Further, the present invention does not require any changes in the test program or operation of the semiconductor test system.

In the following, a filter device is explained which is provided for detecting the monitor information and the like from the information on the tester bus of the semiconductor test system.

The filter device of the present invention is a hardware structure which performs a binary search process known in the software technology.

Therefore, to explain the filter device of the present invention, the search method based on the binary search by software is described first.

FIG. 10 is a schematic diagram for showing a pre-process for conducting the binary search.

Prior to the process of the binary search, it is necessary to define the search data, i.e., what data to search, through the computer and store the search data in, for example, a memory (such as D resistor).

In order to simplify the explanation, the search data in this case is fourteen numeric values (1, 3, 5, . . . 25, 28) of decimal numbers.

With reference to the numeric values, the search data is aligned in the descending order (28, 25, . . . 5, 3, 1) from a large value to a small value.

Also, nMAX, which is a $2^n$ number larger than the number of search data and closest to the number of search data will be calculated.

In this case, since the number of search data is fourteen (14), it becomes n=4 and nMAX=16.

Here, the address J of the memory (D resistor) will be denoted from 1 to nMAX, and the data of address J will be indicated as D[J].

In addition, as shown in FIG. 10, the fourteen numeric values of the search data will be filled in the memory (D register) in such an order that a larger numeric value of the search data is stored in the memory area of a larger address number.

Figure 11:
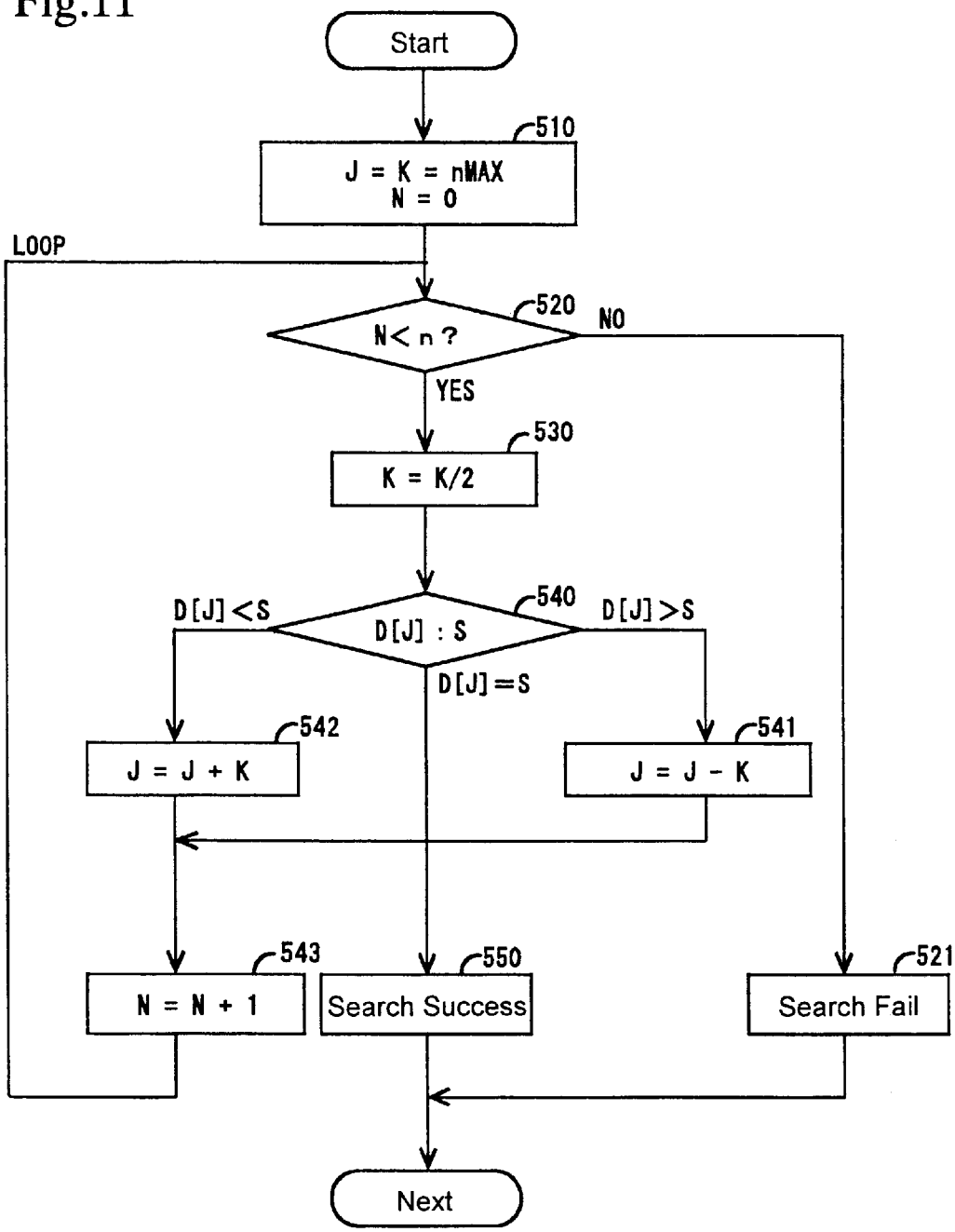
FIG. 11 is a basic flow chart showing an operation in the conventional binary search process.

Next, the operational procedure of the binary search through the software process will be explained with reference to the flow chart of FIG. 11.

In this example, the search data is a numeric value of "11" and thus input data (search data specified by the user) is S=11.

(1) An initial setting is made so that J=K=nMAX, and an initial value N=0 (step 510). In this example, it is assumed that J=16, K=8, and n=4.

(2) It is determined whether N is smaller than n, and if it is, the process moves to step 530, and if not, the process moves to step 521 (step 520). In the specific example above, since n=4, the process proceeds to step 530 if N is smaller than 4, and if N is larger than 5, the process moves to step 521.

(3) K is divided in half (1/2) to be new K (step 530). In the specific example, when N=0, new K becomes K=8 when the previous K=16 is divided in half (1/2). When N=1, new K becomes K=4 when the previous K=8 is divided in half (1/2). When N=2, new K becomes K=2 when the previous K=4 is divided in half (1/2). When N=3, new K becomes K=1 when the previous K=2 is divided in half (1/2).

(4) The last data D[J] of the memory and the search data S are compared, and when D[J]<S, then the process moves to step 541, and when D[J]<S, the process moves to step 542. When D[J]=S, the process moves to step 550 where the search process is completed (step 540).

In the specific example above, when N=0, J=16 and D[16]=28, making D[16]>11, the process moves to step 541.

When N=1, J=8 and D[8]=10, making D[8]<11, the process moves to step 542.

When N=2, J=12 and D[12]=20, making D[12]>11, therefore the process moves to step 541.

When N=3, J=10 and D[10]=13, making D[10]>11, the process moves to step 541.

When N=4, J=9 and D[9]=11, making D[9]=11, therefore, process moves to step 550.

(5) When D[J]>S, in step 541, J is subtracted by K, which makes new J (step 541).

In the specific example, when N=0, J=16 and K=8, therefore, new J is J=8.

When N=2, J=12 and K=2, therefore, new J is J=10.

When N=3, J=10 and K=1, therefore, new J is J=9.

(6) When D[J]<S, in step 542, J is added by K, which makes new J (step 542).

In the specific example, when N=1, J=8 and K=4, therefore, new J is J=12.

(7) Then, N is incremented by one, i.e., N+1, and the process goes back to step 520 to repeat the above noted loop process (step 543).

In the specific example, where N=0, 1 is added to N, making N=1 and the operation returns to step 520.

When N=1, 1 is added to N, making N=2 and the operation returns to step 520.

When N=2, 1 is added to N, making N=3 and the operation returns to step 520.

When N=3, 1 is added to N, making N=4 and the operation returns to step 520.

(8) When D[J]=S, then the input data and the search data match with one another, therefore, the process proceeds to the step 550 indicating the successful search (step 550).

In the specific example above, when N=4, the input data of 11 and the data D[9]=11 from the memory match with each other, resulting in the successful search.

(9) When N n, i.e., N is equal to or larger than n, the process moves to the next step where the search process fails (step 521).

In the specific example, the search is unsuccessful when N=5, and therefore the process ends.

Figure 8:
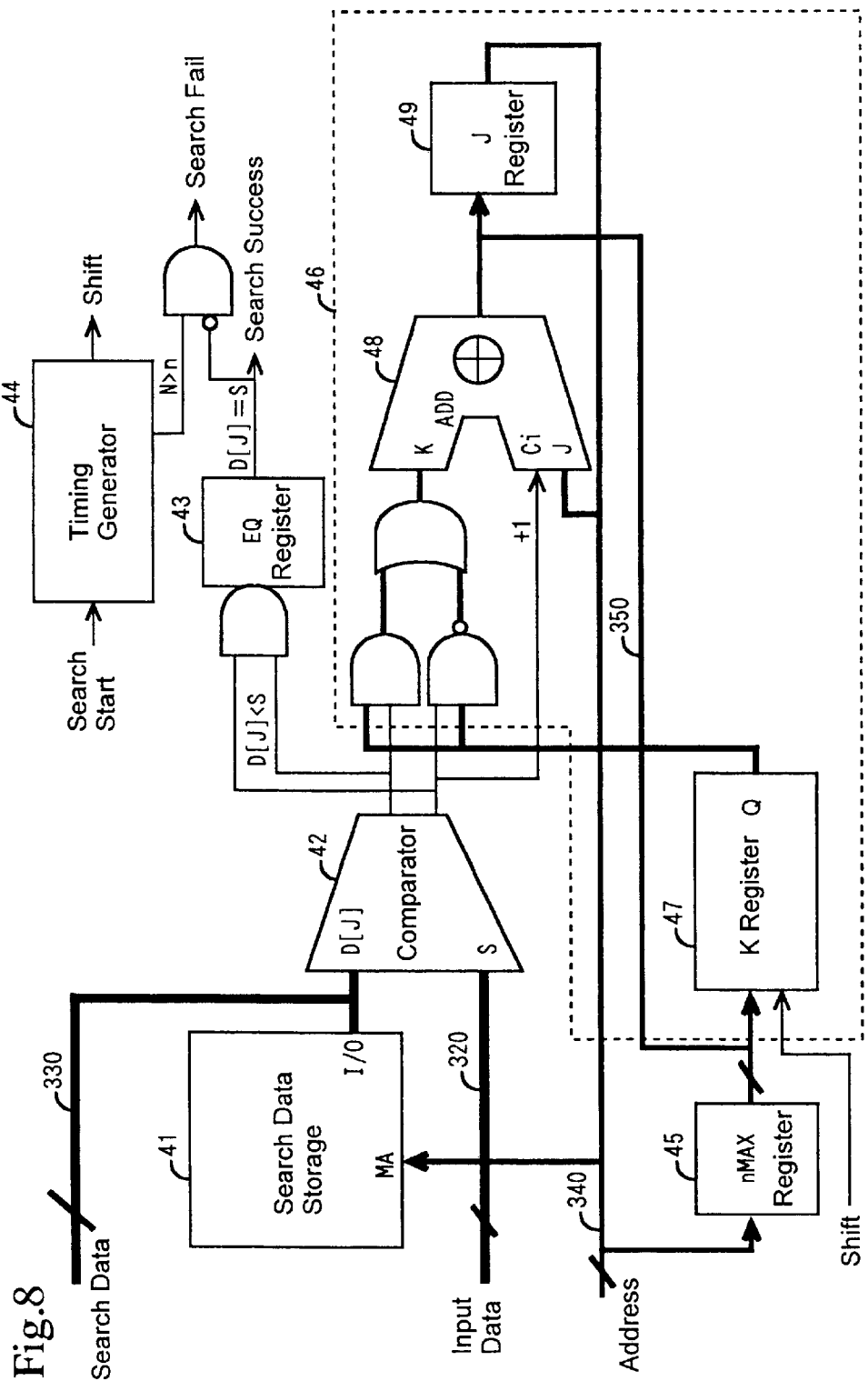
FIG. 8 is a block diagram showing a filter device of the present invention.

With reference to FIGS. 8 and 10, the binary search process described above is applied to the filter device of the present invention. The filter device is a hardware structure for achieving the binary search process described above.

In the example of FIG. 8, the filter device of the present invention is mainly comprised of a search data storage 41, a data comparator 42, an EQ register 43, a timing generator 44, an nMAX register 45, and an address generator 46.

The search data storage 41 is a memory for writing data therein and reading the data therefrom.

The data comparator 42 is a means for comparing numeric values of two pieces of data and generating a signal indicating the comparison result.

The EQ register 43 is a register for storing the comparison result when there is a match between two inputs of the data comparator and generating a flag indicating the match.

The timing generator 44 is to control the timings of the operation of the filter device by initializing the registers in the filter device, controlling the timing of the address latch as well as controlling the operation of the data comparator. The timing generator 44 is comprised of delay elements with delay times such as in the range of several nanoseconds to several ten nanoseconds, logic elements, and registers.

The nMAX register 45 is a register for storing the data indicating the $2^n$ number which is larger than the number of search data and is closest to the number of search data.

The address generator 46 is comprised of a K register 47, a full adder 48, a J register 49, and gate components and generates address data.

Next, a pre-operational procedure for conducting the binary search by the filter device of the present invention will be explained in the same manner as described with respect to the software process.

In the pre-process, it is necessary to determine the desired search data and store the search data in the search data storage 41 through a bus 330.

As in the previous example, it is assumed that the number of search data is fourteen. The search data is a decimal number of 1, 3, 5, . . . 25, and 28.

By evaluating with respect to the numeric values, the search data is aligned in the descending order, from a larger number to a small number (28, 25, . . . 5, 3, and 1).

Also, the nMAX, which is a $2^n$ number larger than the number (14) of the search data and is the closest to the number of search data is calculated.

In this case, n=4 and thus, nMAX=16 (larger than 14 and closest to 14) which is transferred from the computer to a register in the timing generator 44 and the register nMAX 45 and stored therein.

In addition, as shown in FIG. 10, the fourteen numeric values of the search data will be filled in the search data storage 41 in such a order that a larger numeric value of the search data is stored in a larger address number.

Next, the operational procedure of the binary search for the filter device of the present invention shown in FIG. 8 will be explained below in an itemized manner.

(1) Input data S is applied through a bus 320 and to the data comparator 42.

(2) A search start signal is fed to the timing generator 44 from an external computer.

(3) At the timing determined by the timing generator 44, J resistor 49 and K register 47 in the address counter 46 are initialized to nMAX value through an address bus 350.

(4) The data D[J] in the address J of the search data storage 41 is read-out in response to the address from the J register 49.

(5) The data comparator 42 compares the data D[J] read from the search data storage 41 and the input data S.

(6) When the result of comparison by the data comparator 42 is D[J]>S, then the full adder 48 obtains J=J+K.

(7) When the result of comparison is D[J]<S, then the full adder 48 obtains J=J−K.

However, since a direct addition cannot be performed by the full adder 48, the computation of J=J−K is conducted by adding a complement K of 1 (J=J+(K+1)) to J. The result of the computation indicating the address J is transmitted to the J register 49.

(8) When the result of comparison by the data comparator 42 is other than D[J]<S or D[J]>S, namely, it is D[J]=S, then the search is a success, and therefore, the next processing circuit is notified with a search success through a flag generated by the EQ register 43. The filter device waits for the next search start signal.

(9) By a shift signal from the timing generator 44, the K register 47 is shifted by one bit toward right, thereby conducting K=K/2 calculation.

(10) N=N+1 is conducted by shifting the register within the timing generator 44 by one bit.

(11) The steps from (4) to (10) are repeated until N becomes greater than n.

(12) When N is greater than n, then the unsuccessful search will be notified to the next processing circuit while the filter device waits for the next search start signal.

By using the above mentioned filter device of the present invention to conduct a binary search, the time it takes to obtain the search results from the search data can be significantly reduced.

For example, in the traditional software method where the search data was incorporated into the computer and the search results were notified to an external circuit, the time it takes to complete a search from a data group of $2^{19}$ is 10 $\mu$s. However, the search time is reduced to 1.5 $\mu$s when the filter device of the present invention is used.

Next, the structure and method for adding the filter device of the present invention to the monitor device of the semiconductor test system to process a high-speed data will be explained with reference to FIG. 9.

Figure 9:
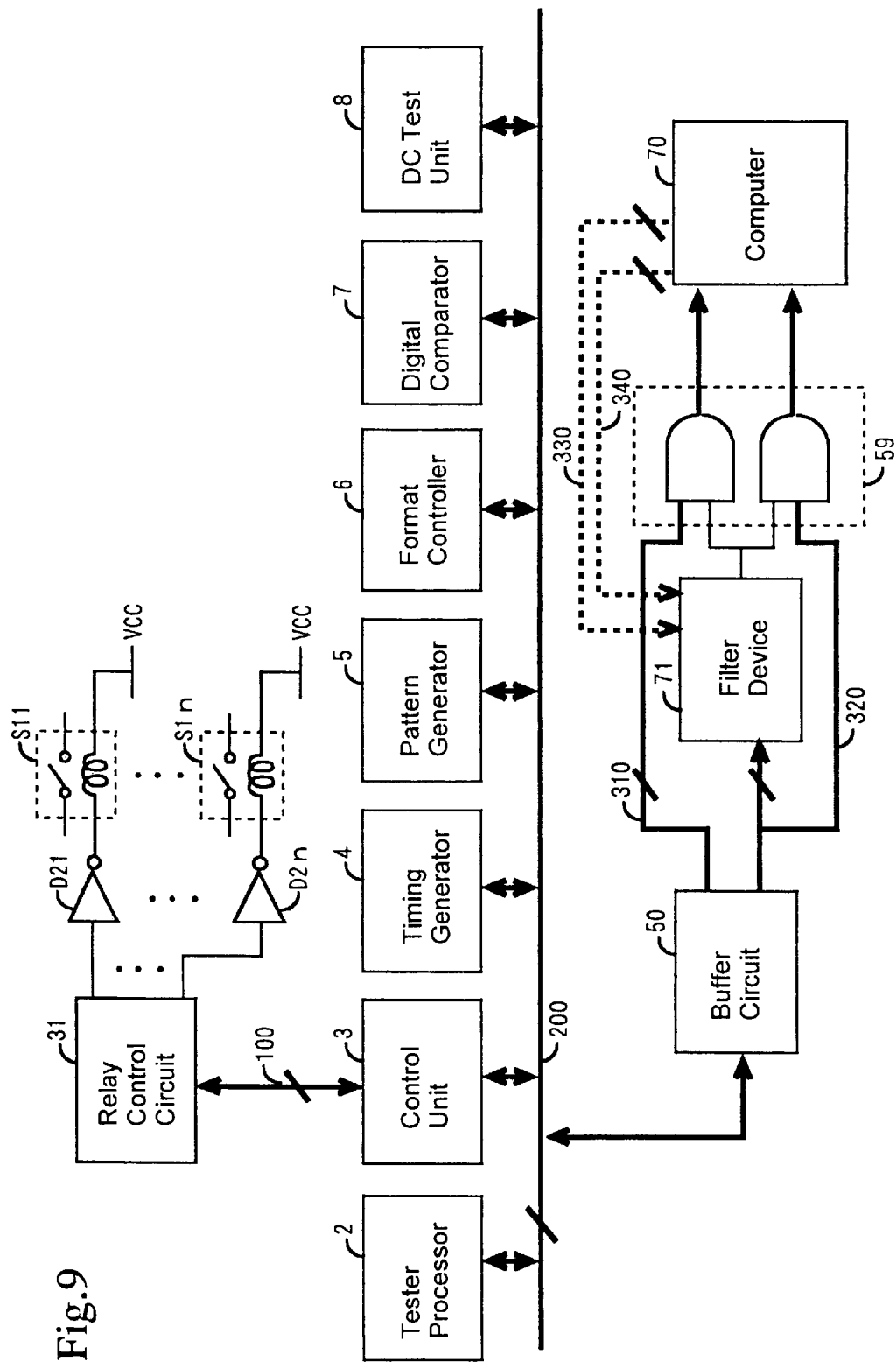
FIG. 9 is a block diagram showing a structure in the semiconductor test system wherein the filter device of the present invention is incorporated.

As shown in FIG. 9, the buffer circuit 50 is connected to the tester bus 200 of the semiconductor test system. The buffer circuit 50 is also connected to the computer 70 through the filter device 71 of the present invention.

In addition, a gate means 59 is provided which receives a bus 320 signal of the address bus signal and a bus 310 signal of the data bus signal, to transfer the output signals to the computer 70.

The search data is sent from the computer 70 to the search data storage 41 in the filter device 71 through the bus 330, and the address bus signal is sent from the computer 70 to the search data storage 41 in the filter device 71 through the bus 340.

Furthermore, the notification signal of the flag indicating a successful search from the filter device 71 is used as a gate signal of the gate means 59 noted above.

In this arrangement, the address bus signal 320, which is the output of the buffer circuit 50, is received as the input data for the filter device 71.

Thus, by the filter device 71, only addresses and the associated data in the output of the buffer circuit 50 which match with the search data are transmitted to the computer 70.

Therefore, since the data provided to the computer 70 is filtered by the filter device 71 before being received by the computer 70, high speed data analysis can be achieved.

INDUSTRIAL APPLICABILITY

The present invention is implemented in the embodiment described in the foregoing and has the following effects:

Namely, the information data of the semiconductor test system retrieved by the computer 70 includes the historical information of various components in the test system such as relays, motors and other components of relatively short life-span, such historical information of individual component can be monitored and displayed along with the warning message.

Also, even the lead relays that have differences in life span depending on the ON/OFF operations of either wet or dry conditions can be monitored separately, thereby easily determining timings for replacing the lead relays and thus decreasing the maintenance time and cost.

Moreover, the historical test information such as the operational time of motors used in the semiconductor test system and the capacitor ripples can be analyzed and displayed separately, which makes the maintenance management of the short-life components easier.

Further, with use of the filter device of the present invention, the input data which matches the search data can be retrieved at high speed.

By applying the filter device to the monitor apparatus of the semiconductor test system, a high-speed analysis of the data bus information can be conducted.

What is claimed is:

1. A semiconductor test system, comprising:

a memory means for storing information concerning control signals;

an analysis means for analyzing the information on the control signals read from the memory means; and a life-predicting means for predicting life spans of components of short life based on the analyzed information obtained by the analysis means.

2. A semiconductor test system, comprising:

a memory means for storing information concerning control signals; and an analysis means for analyzing the information on the control signals read from the memory means;

thereby monitoring a test history associated with the semiconductor test system.

3. A semiconductor test system, comprising:

a memory means for storing information concerning control signals;

a filter means for retrieving information in the control signals read from the memory means based on search data;

an analysis means for analyzing the information in the signal retrieved by the filter means; and a life-predicting means for predicting life spans of components of short life based on the analyzed information obtained by the analysis means.

4. A semiconductor test system for testing a semiconductor device by controlling test circuits in the test system through a tester bus and for monitoring a test history thereof, comprising:

a plurality of buffer circuits for receiving signal information from the tester bus and temporarily storing the signal information therein; and a computer for storing the signal information from the buffer circuits in a file and analyzing the signal information in the file.

5. A semiconductor test system for testing a semiconductor device by controlling test circuits in the test system through a tester bus and for monitoring a test history thereof, comprising:

a first buffer for receiving signal information from the tester bus and temporarily storing the signal information therein;

a second buffer for receiving signal information from the tester bus and temporarily storing the signal information therein;

a first switch means for alternately providing the signal information from the tester bus to the first buffer or the second buffer;

a second switch means for selecting the second buffer when said first switch connects to the first buffer and for selecting the first buffer when said first switch connects to the second buffer, and alternately outputting the signal information; and a computer for storing the signal information from the second switch means in a file and analyzing the signal information in the file.

6. A semiconductor test system as defined in claim 3, 4 or 5, wherein said monitored test history is an accumulated value of numbers of operation of relays in the semiconductor test system.

7. A semiconductor test system as defined in claim 6, wherein said monitored test history is an accumulated value of numbers of wet and dry operations of the relays in the semiconductor test system.

8. A semiconductor test system as defined in claim 6 or 7, wherein a limit number is defined for said accumulated value to display a warning signal when said accumulated value reaches said limit number.

9. A semiconductor test system as defined in claim 3, 4 or 5, further comprising a filter means for allowing only predetermined signals in said signal information on said tester bus to transfer to said buffer circuit.

10. A monitor apparatus for use with a semiconductor test system for testing a semiconductor device and monitoring a test history thereof, comprising:

a buffer circuit for storing control signal information regarding controls in the semiconductor test system; and a computer for storing the signal information from the buffer circuit in a file and analyzing the signal information in the file.

11. A monitor apparatus for use with a semiconductor test system for testing a semiconductor device and monitoring a test history thereof, comprising:

a plurality of buffer circuits connected to a tester bus which controls test circuits in the semiconductor test system for alternately storing control signal information on said tester bus; and a computer for alternately receiving the signal information from the buffer circuit and storing the signal information in a file and analyzing the signal information in the file.

12. A monitor apparatus for use with a semiconductor test system for testing a semiconductor device and monitoring a test history thereof, comprising:

a first buffer connected to a tester bus of the semiconductor test system for receiving signal information from the tester bus and temporarily storing the signal information therein;

a second buffer connected to a tester bus of the semiconductor test system for receiving signal information from the tester bus and temporarily storing the signal information therein;

a first switch means for alternately providing the signal information from the tester bus to the first buffer or the second buffer;

a second switch means for selecting the second buffer when said first switch connects to the first buffer and for selecting the first buffer when said first switch connects to the second buffer, and alternately outputting the signal information; and a computer for storing the signal information from the second switch means in a file and analyzing the signal information in the file.

13. A monitor apparatus for use with a semiconductor test system as defined in claim 10, 11 or 12, wherein said monitored test history is an accumulated value of numbers of operation of relays in the semiconductor test system.

14. A monitor apparatus for use with a semiconductor test system as defined in claim 13, wherein said monitored test history is an accumulated value of numbers of wet and dry operations of the relays in the semiconductor test system.

15. A monitor apparatus for use with a semiconductor test system as defined in claim 13 or 14, wherein a limit number is defined for said accumulated value to display a warning signal when said accumulated value reaches said limit number.

16. A monitor apparatus for use with a semiconductor test system as defined in claim 10, 11 or 12, further comprising a filter means for allowing only predetermined signals in said signal information on said tester bus to transfer to said buffer circuit.

17. A monitor apparatus for use with a semiconductor test system which tests a semiconductor device under test by controlling a plurality of relays therein, comprising:

a means for storing a number of ON/OFF operations of the relays under dry condition wherein no electric current flows through contacts of the relays and a number of ON/OFF operations of the relays under wet condition wherein electric current flows through the contacts of the relays; and a means for analyzing a test history based on the number of ON/OFF operations stored in the storing means.

* * * * *